United States Patent [19]

Lott et al.

[11] Patent Number: 4,965,702
[45] Date of Patent: Oct. 23, 1990

[54] CHIP CARRIER PACKAGE AND METHOD OF MANUFACTURE

[75] Inventors: John W. Lott, Durham; Thomas R. Poulin, Cary; Patrick W. Wallace, Chapel Hill, all of N.C.

[73] Assignee: E. I. Du Pont de Nemours and Company, Wilmington, Del.

[21] Appl. No.: 368,481

[22] Filed: Jun. 19, 1989

[51] Int. Cl.⁵ .............................................. H05K 1/18
[52] U.S. Cl. .................................... 361/401; 29/838; 29/844; 29/854; 357/80; 361/406; 361/408; 361/414

[58] Field of Search ................. 29/838, 843, 844, 854, 29/857; 174/52.4; 361/386, 398, 400, 401, 404–406, 408, 414; 357/80

[56] References Cited

U.S. PATENT DOCUMENTS

| 3,969,815 | 7/1976 | Hacke et al. ........................... 29/625 |
| 4,517,050 | 5/1985 | Johnson et al. ...................... 156/643 |
| 4,608,592 | 8/1986 | Miyamoto ........................ 174/52.4 |
| 4,630,172 | 12/1986 | Stenerson et al. .................. 361/414 |

Primary Examiner—Gregory D. Thompson

[57] ABSTRACT

An improved integrated chip carrier package contains closely spaced electrical leads which facilitates contact with leads from the chip.

13 Claims, 1 Drawing Sheet

CHIP CARRIER PACKAGE AND METHOD OF MANUFACTURE

BACKGROUND OF THE INVENTION

The present invention is directed to a novel chip carrier package and an improved method for interconnecting conductive layers in a chip carrier package.

With the advent of sophisticated equipment in the electrical and electronic fields, it has become necessary that the components of the various pieces of equipment conform to high standards which are set forth in the specifications of these components. For example, circuit boards which are used in relatively complicated pieces of equipment such as main frame computers, must be of a relatively high standard of quality in order to function in an efficient manner for a long period of time without deteriorating or breaking down, and thus causing an interruption in the function of the machine. This high quality of material and design is opposed to pieces of equipment requiring a lower standard of quality such as those used in personal computers, high quality television equipment, radios etc.

Circuit boards are prepared by laminating conducting sheets, e.g. copper sheets, with sheets of electrical insulating materials, such as glass fiber reinforced polyester resin sheets or nonreinforced polyimides. Such electrical circuit boards may be either rigid or flexible, and are further classified as single-sided (metal foil on one side of the insulating material only), double-sided (metal foil on both sides of the insulating material), or multilayered. Further for those circuit boards which are multilayered, the conductive layers within the package must be interconnected, for example with plated through holes as well as interconnected to other circuit boards or electrical components. Further still, there are multi-layered circuit boards which contain a semiconductor chip, called chip carrier packages.

Current trends in the interconnect industry, especially for computer uses are moving toward higher signal, power and ground line densities, smaller size packages, and increased performance characteristics, such as less crosstalk, lower inductances, and greater resistance to failure from thermal cycling mechanical stress. These trends have placed greater demands upon design characteristics of multilayer interconnect packages such as chip carrier packages, and have made it more difficult to interconnect multiple conductive layers.

U.S. Pat. No. 4,517,050 discloses the method by which a conductive through-hole hole is formed through a dielectric sandwiched between conductors by forming a noncircular hole in a conductor, etching a hole through the dielectric and by deforming the conductor which has been undercut during the etching. This method does not permit for high dense packing of lines, as the holes formed in the conductive layer and the annular ring of conductor around such holes take up space needed for the circuit lines. This method can take up 22.5 mils on the conductive layer for interconnection purposes.

U.S. Pat. No. 3,969,815 discloses a process for providing electrical interconnection of two metal layers positioned on opposite sides of a substrate. A hole is initially drilled or bored completely through the two metal layers and the intermediate insulating layer. The hole in the insulating layer is enlarged by a selective etching process which only etches the insulating layer to form an enlarged annular hole in the insulating layer which undercuts the metal layer portions. Thereafter these overhanging metal portions on opposite sides of the insulating layer are deformed by pressure to contact or almost contact one another. The deformed metal portions are coated by galvanic metal which is overcoated by a thin layer, preferably tin, to form a conductive path. This process requires much tooling and set up work for the manufacture of the circuit board.

SUMMARY OF THE INVENTION

It is an object of this invention to provide a method of interconnecting an uppermost conductive layer to a first conductive layer below, without drilling and the associated tooling requirements.

A further object of this invention is to provide a method of interconnecting conductive layers in which circuit line densities on a conductive layer are not limited by the interconnection between the conductive layers. Interconnection of circuit lines from layer to layer, as taught by prior art methods, consumes much space on the layers thus reducing the amount of space available for circuit lines. Distances between circuit line centers can be as small as 6 mil in this invention, so that the density of circuit lines on a layer is increased.

Another object of this invention is to provide a method of interconnecting conductive layers at the inner and/or outer edges of the conductive layers of a chip carrier package. Many prior art methods teach interconnection of conductive layers interior to an electrical package.

Another object of this invention is to provide for an electrical multilayer conductive package which partitions the power supply system of the package from the signal transmission system as much as practical in order to optimize the performance of both.

Still another object of the invention is to provide for an electrical multiconductive layer package in which the interconnection from a first conductive layer to a second conductive layer is flexible and yet very reliable so that the total package has excellent resistance to failure from thermal cycling mechanical stress.

The present invention is directed to a chip carrier package comprising
  (a) a receptacle containing side walls adapted to hold a chip in a fixed relationship and allow leads from the chip to make electrical contact with plurality of electrical conductors,
  (b) a first plurality of electrical conductors present in a plane wherein a portion of each electrical conductor terminates at or adjacent to a side wall of the receptacle to enable electrical contact with a second plurality of electrical conductors,
  (c) a first insulating layer which faces one surface of the first plurality of electrical conductors,
  (d) a second insulating layer which faces an opposite surface of the first plurality of electrical conductors and separates the first plurality from a second plurality of electrical conductors whereby the second insulating layer terminates in a wall adjacent but separate from a side wall of the receptacle whereby terminal portions of the first plurality of electrical conductors are exposed,
  (e) a second plurality of electrical conductors present in a plane wherein terminal portions of at least a portion of the conductors initially in the plane are bent to make electrical connection with the first plurality of electrical conductors.

Also the present invention is directed to a method of forming the chip carrier package.

DETAILED DESCRIPTION OF THE INVENTION

Figure 1:
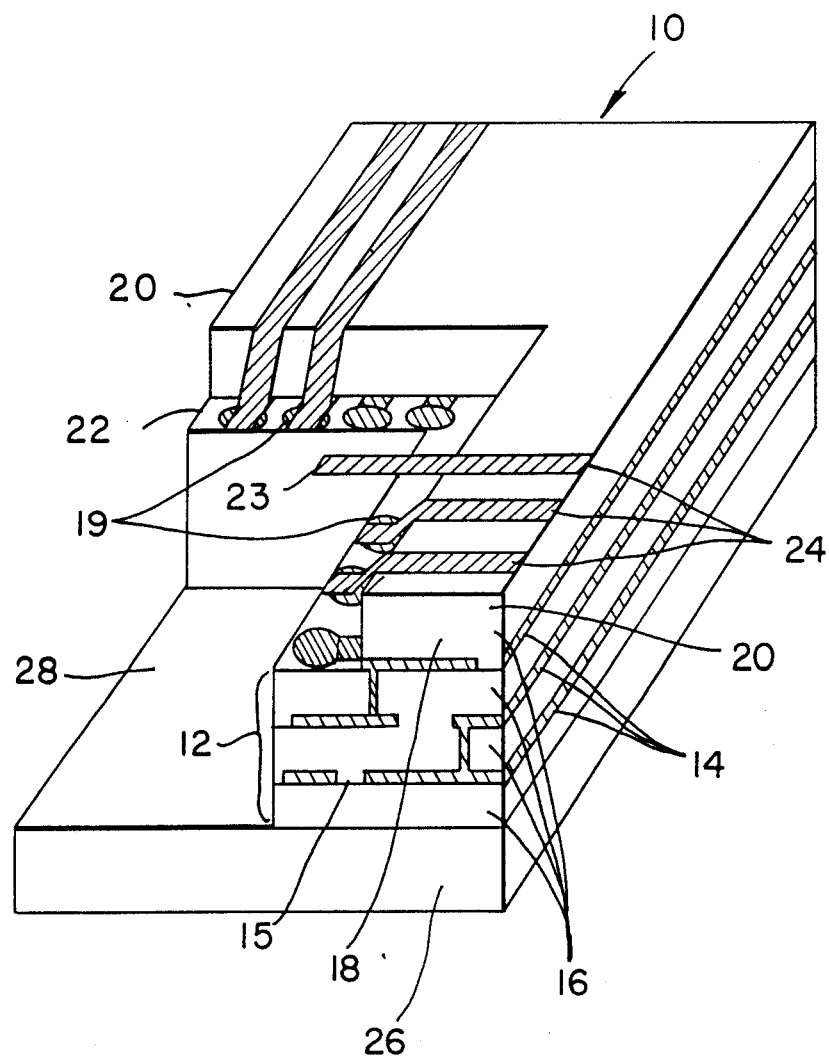
FIG. 1 is an angled perspective view of a chip carrier package.

The present invention is particularly adapted for forming interconnections between conductive layers separated by dielectric layers in a chip carrier package. More particularly, the present invention relates to the formation of an unsupported terminus of the circuit lines on an uppermost conductive layer and the subsequent interconnection of the unsupported terminus to bonding pads sites located on an adjacent conductive layer below.

A laminate of an electrically conductive composite, consisting of a metal conductive layer and a dielectric layer with for example an adhesive layer therebetween, are conventional starting materials for forming multilayer boards such as chip carrier packages and are suitable herein. Generally the dielectric layer will be at least one mil in thickness and the conductive layer will be 0.7 to 2.8 mils thick, e.g., copper foil, although both thinner and thicker layers can be used. The materials of construction of the dielectric insulating layer are not critical except that they have the appropriate electrical properties and can be etched using plasma, chemical or laser etching. Examples of materials that are suitable as the dielectric layer include polyimide thermosetting resin polymers, and perfluorinated polymers, such as polytetrafluoroethylene (TFE), copolymers of tetrafluoroethylene and hexafluoropropylene and copolymers of tetrafluoroethylene and perfluoro(propyl vinyl ether) and the like. Even dielectric materials which are supported such as polyaramids in either form of woven or nonwoven fabric such as made from continuous fibers are suitable in this invention so long as the support can also be etched. Metals suitable for the metal conductive layer include copper, silver and gold, with copper being preferred. A particularly preferred laminate is a copper clad polyimide film.

On each of the conductive layers the desired circuit patterns are formed of circuit lines for the package application. This includes the conductive layer which uppermost on the package and which has the terminus of circuit lines for attachment to an adjacent conductive layer. The circuit lines are signal lines, but they can be ground or power lines or pads. The circuit lines are formed preferably by chemical etching which is well known in the formation of printed circuits. An example of such chemical etching involves lamination of a negative acting photosensitive film, for example Riston ® 218R photoresist to the conductor surface which does not face the dielectric layer, exposing the photosensitive polymer to actinic radiation through a photomask, developing and removing unexposed photosensitive polymer to expose portions of the metal layer and thereafter chemically etching completely through the thickness of the exposed conductive layer. The chemical etching step removes little or no material from the dielectric polymer layer. A suitable process is disclosed in Celeste U.S. Pat. No. 3,469,982. Positive working photopolymers with processing techniques well known in the art can likewise be used, e.g., Cohen and Heiart U.S. Pat. No. 4,193,797.

Those conductive layers which form the base of the package are laminated and their respective circuit lines are interconnected to one another by using the known art of photoresist and etching as disclosed in Johnson U.S. Pat. No. 4,472,238, Fritz and Johnson U.S. Pat. No. 4,517,050 and Fritz U.S. Pat. No. 4,635,358.

The formation of the terminus of the circuit lines for the uppermost conductive layer on the circuit side of a metal, adhesive, dielectric laminate structure, is accomplished by conventional etching methods. A metal mask is placed over the dielectric layer of the laminate structure so that various circuit lines having a longer length extend into the center of an etched pattern of signal lines and power and ground lines or pads on the conductive layer where a chip cavity will eventually exist. The laminate structure with mask so positioned, is then etched to undercut and remove the dielectric underlayer of the metal circuit lines extending into cavity area. This etching step also forms a central cavity as the dielectric is completely removed and no metal, other than that of the extended circuit lines remains in the area.

An example of an etching technique which etches completely through the dielectric layer and laterally to undercut the conductive layer and is suitable herein is liquid chemical etching. The etching technique used is dependent upon the type of dielectric material to be removed by the etching process. Particularly preferred method is liquid chemical etching. Liquid etching techniques by which a liquid can etch selectively through a polymeric dielectric are well-known in the art. The etchant will not cause a substantial removal of the conductive material. Suitable etchants include those disclosed in U.S. Pat. No. 3,969,815, and Kreuz and Hawkins U.S. Pat. No. 4,426,253, e.g. a sulfuric acid solution can be used for polyester and epoxide resins while a caustic alcholic solution is suitable for a polyimide. Also etching includes use of solvents capable of removing areas of the dielectric not masked by the conductive matal without any deleterious effect on the metal may be used. Examples of solvents are tetrachloroethylene, methyl chloroform, mixture of 90% tetrachloroethylene and 10% isobutyl alcohol (by volume) and chromic acid.

Two other examples of etching techniques which etch completely through the dielectric layer are laser etching and plasma etching. A method whereby etching of the dielectric is accomplished by an intense beam of light, i.e., laser, is also known to those skilled in the art. This method uses an excimer laser, which produces ultraviolet light. Factors which control the capability and efficiency of the laser are the energy density of the laser pulse, the ablation rate which is the etch depth in the dielectric per pulse and the pulse power. Suitable setting for laser etching a polyimide are 800 to 900 millijoules/cm$^2$ for energy density, ablation rate of 0.2 microns/pulse, and average pulse power of 200 millijoules per pulse. The dielectric is ablated by the laser by either a step and repeat or a scan area method. Frequently a char residue remains where the laser has etched the dielectric. The char residue is easily removed by various techniques. In plasma etching techniques however, a separate metal mask with the window cut out where the cavity will be is placed on the dielectric layer of the uppermost conductive layer. Also during plasma etching, the lines of the circuit pattern on the metal conductive layer can be appropriately formed to serve as a mask for the dielectric since the plasma attacks the dielectric where the dielectric layer is not protected by the metal pattern or mask. The metal is substantially unaffected by the plasma or, at least, the etching rate of the dielectric is considerably faster than the etching rate of the conductor. Various types of plasma gases may be used. The etching gas is chosen so as to produce species which react chemically with the material to be etched to form a reaction product which is volatile. Mixtures of various plasma gases can also be used. A preferred gas composition to be used where the dielectric is a polyimide and the mask is copper is carbon tetrafluoride/oxygen in the ratio of 50/50 to 10/90 by volume.

While laser or chemical etching using a metal mask generally provides straight well-defined edges to the cavity window, the use of plasma etchant requires that an insulator be applied to the underside of the circuit layer on the dielectric layer between the dielectric and a separate metal mask. This apparently minimizes localized cooling of areas of the cavity edge by circuit lines which conduct heat away from the area around them and causing uneven etching. Paper acting as an insulator, for this purpose, was that which was found on the polyimide adhesive. The paper is removed upon completion of this etching method.

An outstanding advantage is the interconnection does not limit the circuit line densities on the conductive layer. Rather the limitations are those of the photoresist to resolve the lines, the tensile strength of the metal and the ability to plate down the extended lines of the uppermost conductive layer. In this invention, the circuit lines on a conductive layer, which is to interconnect with another conductive layer, can have as close as 6 mil and less centers, i.e., a center of an electrical conductor is spaced 6 mils from a center of an adjacent conductor, such as 3 mil wide spaces between circuit lines of 3 mil width. Spacing of conductors of 8, 10, or 12 mils can be easily accomplished. In prior art methods the density of circuit lines on a conductive layer is limited due to the space allotted for the via interconnection of the circuit lines to an adjacent conductive layer below. Interconnection whereby a via is drilled through the conductive layer and the dielectric layer below, and the via enlarged by etching as in U.S. Pat. No. 3,969,815 allows for 10 to 12 mils center to center spacing on the conductive layer. Interconnection whereby the via is formed in the conductive layer by photolighographic methods, and then the dielectric is etched away underneath the hole as taught by Fritz and Johnson in U.S. Pat. No. 4,517,050, allows for about 22.5 mils center to center spacing. Thus this invention provides for an increased density of circuit lines on a conductive layer over the prior art techniques.

The uppermost layer with the unsupported terminus of circuit lines extending into the opening or cavity is attached to the package base such that a shelf which is of a wall construction which can be sloping or at right angles is formed on the top conductive layer of the package base. Attachment of the uppermost layer to the top of the package base, is accomplished by laminating in register, as is well known in the art, with an adhesive layer between the two layers. Thereafter, the extending circuit lines are deformed to come in mating contact with the bonding pads exposed on the shelf of the top conductive layer on the package base. Methods which are suitable for deforming metal lines are by mechanical means or by ultrasonic bonding which are well known to those skilled in the art. Mechanical deformation of the extending metal lines can occur in a laminating press. An instrument suitable for ultrasonic deformation of the extending metal lines is manufactured by Kulick & Soffa, described as a heavy gauge ultrasonic wedge bonder, model number 4127.

Thereafter, if necessary, the deformed electrically conductive material may be electrolytically plated with a metal such as copper, electrolessly plated or soldered or welded to complete or ensure an electrically conductive path.

Turning to the FIGURE, its embodiment shows a chip carrier package (10) comprising of a base (12) with 3 layers of conductive planes (14) which are used as power and ground pathways in the package (10). Underneath between each plane (14) is a dielectric layer (16). The conductive paths used for power and ground for the package (10) are interconnected by means of a series of interconnecting vias (15) formed through the dielectric layers (16) interposed between each plane (14) to paths that are on the top plane layer (18) of the base (12). Selective paths on the top plane layer (18) centrally terminate to contact pads (19). Above the base (12) is a dielectric layer and a circuit layer which has a plurality of signal lines (24), and bonding pads (not shown) for connecting the chip to power and ground layers buried within the package, called the signal layer (20). The signal layer (20) of the package (10), is positioned such that the top plane layer (18) of the base (12) forms a shelf (22) extending out from under the signal layer (20) thereby exposing selective contact pads (19). The terminus (23) of the ground and power pads (not shown) on the signal layer (20) extend over the cavity formed in the dielectric layer under the signal layer (20) and are deformed to connect in a mating fashion to the exposed contact pads (19) on the shelf (22) of the top plane layer (18) of the base (12). The side of the base (12) opposite the signal layer (20) is affixed to a body of metal (26). A cavity or receptacle (28) extends through all of the base (12) forming side walls and signal (20) layers and has as its support the body of metal (26). At a time in the future the package is completed for use by mounting a semiconductor chip on the body of metal (26) and connecting the chip with conductors to the signal lines and to the bonding pads that connect the ground and power paths to the power and ground paths buried within the package.

To further illustrate the present invention the following example is provided.

EXAMPLE 1

An image was formed on the copper surface of a Pyralux ® LF8510 (manufactured by E. I. du Pont de Nemours and Company) flexible circuit laminate, composed of a 1 mil layer of a polyimide dielectric permanently bonded to a 0.5 mil layer of copper with 1 mil layer of Pyralux ® WA adhesive. All adhesive used in this Example is Pyralux ® WA adhesive (manufactured by E. I. du Pont de Nemours and Company) unless otherwise indicated. A circuit pattern was formed on the copper surface of the flexible circuit laminate material by process of chemical etching, as described in U.S. Pat. No. 3,469,982. A sandwich was created of first the flexible circuit material with the newly formed circuit pattern, a Pyralux ® WA 1 mil adhesive layer on top of this first layer, and a new piece of Pyralux ® flexible circuit laminate on top of the adhesive layer. The sandwich was permanently bonded to a metal substrate, for example an aluminum sheet, by contacting the bottom of the first layer, i.e., the dielectric, to the metal substrate with a 1 mil layer of Pyralux ® WA adhesive. Thus the first and second plane layers were attached to the metal substrate.

Via windows with extended "tabs" were formed in the top copper layer cover (which is the second layer of the flexible circuit laminate) by using known art of photoresists and copper etching as disclosed in U.S. Pat. No. 4,517,050. The dielectric layer under the via window "tabs" was removed by using a $CO_2$ laser (manufactured by Coherent General Corp.) followed by plasma etching the sandwich in a carbon tetrafluoride and oxygen mixture for 5 to 15 minutes. The via window "tabs" were deformed mechanically to mate with the corresponding pads formed in the layer below (first layer) (as described in the above cited patents). A photoresist layer was applied to the top copper layer (second layer), then image-wise exposed through a photomask, to form the circuit lines and ground planes on the second layer. The deformed tabs were plated with copper (using an acid copper bath) and then solder (as an etch resist) to their corresponding pad below to make a permanent electrical contact. The photoresist layer was removed and all excess or background copper from the imaged pattern was etched away (using an ammoniacal etchant). Finally the solder etch resist was stripped.

The sandwich was cleaned and baked to prepare for the next layer of flexible circuit composite. The next layer (third layer) of the flexible circuit composite was laminated to the previously prepared layer with an adhesive layer therebetween.

The previously stated steps, that of forming vias, etching away the underlying dielectric layer, deforming the tabs, applying a photoresist layer, exposing to form circuit lines, plating the deformed tabs, removing the photoresist, etching away undesired copper, and removing the solder resist layer were repeated for the third layer.

The sandwich was cleaned and baked to prepare for the next layer of flexible circuit composite. The next layer (fourth layer) of the flexible circuit composite was laminated to the previously prepared layer with an adhesive layer therebetween.

The previously stated steps, that of forming vias, etching away the underlying dielectric layer, deforming the tabs, applying a photoresist layer, exposing to form circuit lines, plating the deformed tabs, removing the photoresist, etching away undesired copper, and cleaning and baking were repeated for the fourth layer. Thus a base element with four conductive circuit planes was formed.

The uppermost layer, a signal layer, was prepared by etching the signal lines as described previously a new piece of Pyralux ® flexible circuit laminate. A window with certain leads extending into its open space was formed in the center of the signal layer flexible circuit using an aluminum mask with a cut out for the window was placed directly over the area to be etched on the adhesive side of the circuit and a sheet of aluminum protecting the signal side. An adhesive layer with white paper backing and a window in the center to correspond to aluminum mask was fashioned by a punch and die, and tack laminated to the polyimide side of the signal layer. The paper used for this purpose was that found on the Pyralux ® WA adhesive. The signal layer was plasma etched with the paper removed after plasma etching.

The signal layer was temporarily affixed to the top layer (fourth layer) of the base element. The signal layer was positioned such that a shelf was formed by the fourth layer containing the contact pads was exposed. Registered holes were formed in the signal layer and the base element using a programmed drill. Pins were inserted into the holes. Then the uppermost signal layer and the base element were laminated together so as to cause the adhesive tacked to the signal layer to bond to the base element and permanently cure while maintaining registration with the bottom layer. The registration pins were removed. The lines for power and ground distribution of the uppermost signal layer which extend into the window were deformed to mate with a corresponding contact pad residing on the shelf of the base element. The extended lines were deformed by mechanical means. The press was pressurized to 1,000 psi to collapse the extended lines onto the contact pads on the shelf. The deformed lines were plated with their mating circuit lines to form a continuous permanent bonded line thus establishing an interconnection from the uppermost signal layer to the layer just below. A cavity from the window edge to the top of the metal support was routed by means of a numerically controlled router into the layers of the base element.

What is claimed is:

1. A layered chip carrier package comprising:
   (a) a receptacle containing side walls forming a recess adapted to hold a chip in a fixed relationship
   (b) a first plurality of electrical conductors present in a plane wherein a portion of each electrical conductor terminates at or adjacent to one of the side walls of the receptacle to enable electrical contact with a second plurality of electrical conductors,
   (c) a first insulating layer which faces one surface of the first plurality of electrical conductors,
   (d) a second insulating layer which faces an opposite surface of the first plurality of electrical conductors and separates the first plurality from the second plurality of electrical conductors whereby the second insulating layer terminates in a wall adjacent but separate from a side wall of the receptacle whereby terminal portions of the first plurality of electrical conductors are exposed,
   (e) the second plurality of electrical conductors present in a plane facing the second insulating layer wherein terminal portions of at least a portion of the plurality of electrical conductors initially in the plane are bent to make electrical connection with the first plurality of electrical conductors.

2. The chip carrier package of claim 1 wherein for the first plurality of electrical conductors a center of an electrical conductor is spaced not greater than 12 mils from a center of an adjacent conductor.

3. The chip carrier package of claim 2 wherein for the second plurality of electrical conductor a center of an electrical conductor is spaced not greater than 12 mils from a center of an adjacent conductor.

4. The chip carrier of claim 3 wherein the spacing is not greater than 10 mils.

5. The chip carrier of claim 4 wherein the spacing is not greater than 8 mils.

6. The chip carrier of claim 5 wherein the spacing is 6 mils.

7. The chip carrier of claim 1 wherein an edge of the first insulating layer forms a portion of the side wall of the receptacle.

8. A process of making a layered chip carrier package comprising:
   (a) forming a receptacle containing side walls forming a recess adapted to hold a chip in a fixed relationship whereby at least a portion of a side wall is a first insulating layer;
   (b) forming a first plurality of electrical conductors in a plane on a surface of the first insulator wherein a portion of each electrical conductor terminates at or adjacent one of the side walls of the receptacle;
   (c) forming a second plurality of electrical conductors in a plane on an insulating surface of a second insulator wherein terminal portions of the second plurality of electrical conductors extend beyond an edge of the insulating surface of the second insulator;
   (d) adhering the second insulator to the first plurality of electrical conductors wherein the second insulator terminates in a wall adjacent but separate from a side wall of the receptacle whereby terminal portions of the first plurality of electrical conductors are exposed;
   (e) bending the terminal portions of the second plurality of electrical conductors to contact the first plurality of electrical conductors.

9. The process of claim 8 wherein for the first plurality of electrical conductors a center of an electrical conductor is spaced not greater than 12 mils from a center of an adjacent conductor.

10. The process of claim 9 wherein for the second plurality of electrical conductors a center of an electrical conductor is spaced not greater than 12 mils from a center of an adjacent conductor.

11. The process of claim 10 wherein the spacing is not greater than 10 mils.

12. The process of claim 11 wherein the spacing is not greater than 8 mils.

13. The process of claim 12 wherein the spacing is not greater than 6 mils.

* * * * *